United States Patent

Gerner et al.

[11] Patent Number: 5,726,465
[45] Date of Patent: Mar. 10, 1998

[54] LIGHT EMITTING DIODE

[75] Inventors: Jochen Gerner, Wiesloch; Klaus Gillessen, Heilbronn; Albert Marshall, Flein, all of Germany

[73] Assignee: TEMIC TELEFUNKEN microelectronic GmbH, Heilbronn, Germany

[21] Appl. No.: 694,506

[22] Filed: Aug. 7, 1996

[30] Foreign Application Priority Data

Oct. 9, 1995 [DE] Germany .................. 195 37 543.2

[51] Int. Cl.⁶ .................. H01C 33/00; H01L 31/0328
[52] U.S. Cl. .................. 257/103; 257/104; 257/106; 257/109; 257/199; 257/200; 257/461
[58] Field of Search .................. 257/82, 85, 103, 257/104, 106, 109, 196, 199, 200, 461

[56] References Cited

U.S. PATENT DOCUMENTS

| | | | |
|---|---|---|---|
| 4,062,035 | 12/1977 | Winstel | 257/94 |
| 5,048,035 | 9/1991 | Sugawara et al. | |
| 5,153,889 | 10/1992 | Sugawara et al. | |
| 5,233,204 | 8/1993 | Fletchen et al. | 257/97 |
| 5,317,167 | 5/1994 | Izumiya et al. | |
| 5,359,209 | 10/1994 | Huang | |
| 5,414,281 | 5/1995 | Watabe et al. | 257/95 |
| 5,444,269 | 8/1995 | Adomi et al. | |

FOREIGN PATENT DOCUMENTS

| | | |
|---|---|---|
| 0420691 | 4/1991 | European Pat. Off. |
| 0434233 | 6/1991 | European Pat. Off. |
| 0616377 | 9/1994 | European Pat. Off. |
| 0627772 | 12/1994 | European Pat. Off. |
| 2270199 | 3/1994 | United Kingdom. |

OTHER PUBLICATIONS

H. Sugawara et al.: "High-brightness InGaAlP green light-emitting diodes". In: Appl. Phys. Lett. 61 (15), Oct. 12, 1992, pp. 1775–1777.

J.-F. Lin et al.: "Highly reliable operation of indium tin oxide AlGaInP orange light-emitting diodes". In: Electronics Letters, Oct. 13, 1994, vol. 30, No. 21, pp. 1793 and 1794.

K.H. Huang et al.: "Twofold efficiency improvement in high performance AlGaInP light-emitting diodes in the 555–620 nm spectral..." In: Appl. Phys. Lett. 61 (9), Aug. 31, 1992, pp. 1045–1047.

*Primary Examiner*—Tom Thomas
*Assistant Examiner*—Fetsum Abraham
*Attorney, Agent, or Firm*—Spencer & Frank

[57] ABSTRACT

An light emitting diode of indium gallium aluminum phosphide with a substrate, an electrical contact to the substrate, a dual hetero structure as a active zone comprising a first cladding layer, an active layer and a second cladding layer to which, a window layer is applied, and to which in turn, an electrical contact is applied. This window layer is made of gallium aluminum phosphide.

4 Claims, 1 Drawing Sheet

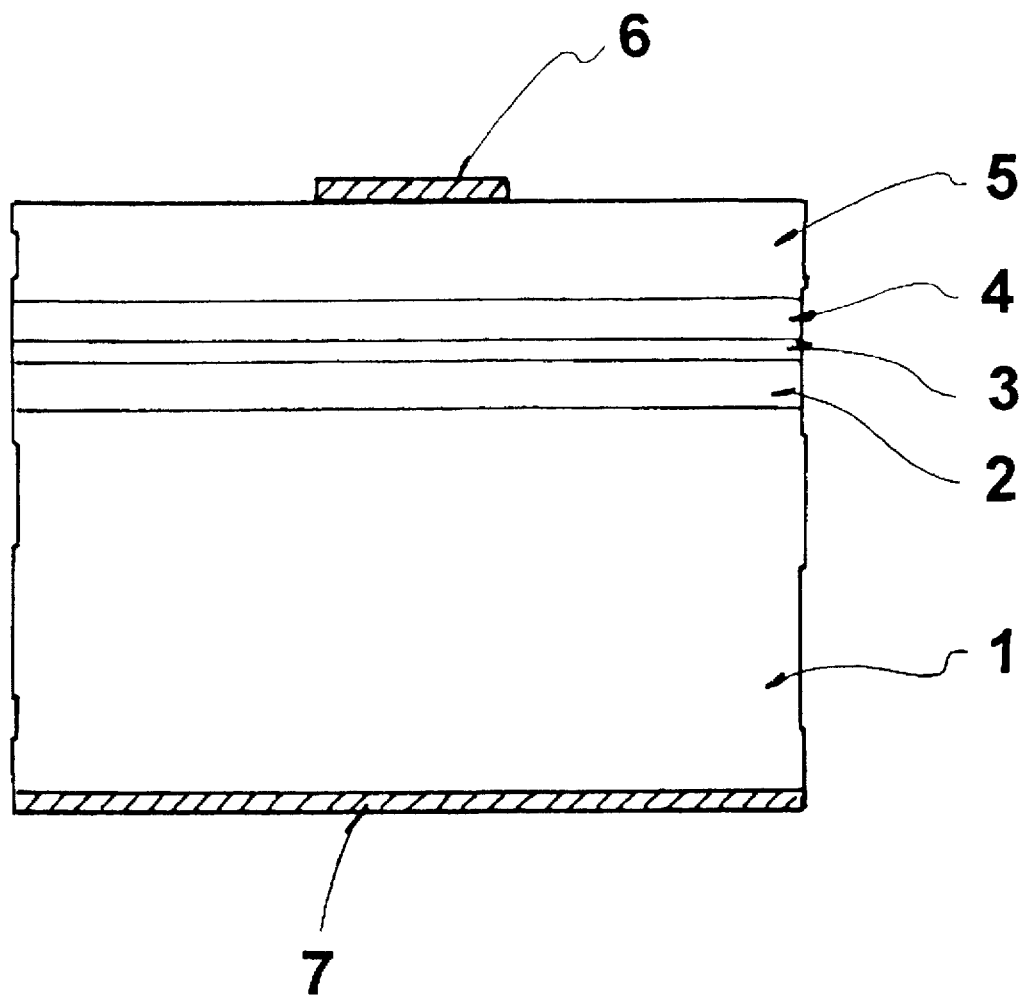

LIGHT EMITTING DIODE

BACKGROUND OF THE INVENTION

The invention relates to a light emitting diode of indium gallium aluminum phosphide ((InGaAl)P) with a substrate, an electrical contact to the substrate, a dual hetero structure as an active zone comprising a first cladding layer, an active layer and a second cladding layer to which a window layer is applied and to which in turn an electrical contact is applied.

Light emitting diodes (LEDs) are used among other things for indicating and lighting purposes. They are characterized by small size, compatibility with electronic systems, great robustness and reliability, as well as long life. In particular, light emitting diodes of indium gallium aluminum phosphide ((InGaAl)P) are at the present time the brightest components of this kind. They consist of an active layer of the composition $In(0.48)Ga(0.52-x)Al(x)P$, where x is selected in the range 0.05 to 0.25 depending on the desired color or emission wavelength. For instance, an Al content of $x=0.05$ provides an orange-red emission with a wavelength of about 620 nm, a value of $x=0.15$ a yellow emission of 590 nm, and $x=0.25$ a green emission of about 560 nm. This active layer is enclosed between two further layers of $In(0.48)Ga(0.52-y)Al(y)P$ which have a higher Al content ($y>x$) and thus a higher band distance than the active layer. This three-layer arrangement is known as a dual hetero structure. By selecting 0.48 for the In content, all three layers in the dual hetero structure have the same grating constant as gallium arsenide (GaAs) and can therefore be deposited epitaxially on a gallium arsenide substrate with good crystalline perfection. It is also known among experts that it is difficult and elaborate to produce layers of indium gallium aluminum phosphide (InGaAl)P in a greater thickness and with higher conductivity. For light emitting diodes of this material, this means that the current propagation from, for example, a circular surface contact over the entire cross-sectional area of the diode is generally insufficient and that, as a consequence, a considerable part of the light that is mainly generated below the non-transparent contact will be lost. To minimize this problem, another layer is usually applied above the dual hetero structure, and this layer should be as conductive as possible and be transparent for the generated light.

This so-called current propagation and window layer is made of various materials in the known light emitting diodes. In the publication in Applied Physics Letters 61 (1992), pp 1775–1777, a layer of $Ga(0.2)Al(0.8)As$ is described. The authors of the publication in Electronic Letters 30 (1994), pp 1793–1794, use indium tin oxide (ITO). In EP 0 434 233, a transparent window layer of gallium arsenide phosphide (GaAsP) or gallium phosphide (GAP) is described. In EP 0 627 772, a current propagation layer of gallium aluminum arsenide phosphide (GaAl)(AsP) is described that is matched to the grating constant of the dual hetero structure beneath it by a small phosphorus content of 0 to 8%. Furthermore, combinations of several different materials are known, e.g., gallium aluminum arsenide (GaAl)As with a corrosion protection layer of indium gallium phosphide (InGa)P, as proposed in EP 0 616 377. It is also known how to produce this layer of gallium phosphide with an underlying GaAs buffer layer.

Although these known window layers considerably increase the brightness of the light emitting diodes of indium gallium aluminum phosphide (InGaAl)P, all materials used so far display certain disadvantages: gallium aluminum arsenide (GaAl)As is not transparent enough for yellow and green emission and, if the aluminum content is greater, unstable with respect to moisture. Indium tin oxide (ITO) results in an unacceptably high contact resistance, and even gallium phosphide (GAP) reveals considerable absorption especially in the green spectral range.

SUMMARY OF THE INVENTION

The object of the invention is therefore to specify a material for the window layer that leads to an even better improvement in brightness and ensures good environmental compatibility.

This object is solved in accordance with the invention by the window layer being made of gallium aluminum phosphide (GaAl)P.

In a light emitting diode of indium gallium aluminum phosphide ((InGaAl)P) with a substrate, an electrical contact to the substrate, a dual hetero structure as active zone comprising a first cladding layer, an active layer and a second cladding layer to which a window layer is applied and to which in turn an electrical contact is applied, the window layer is made of gallium aluminum phosphide (GaAl)P.

The aluminum content of the window layer is between 0.1% and 50%.

The thickness of the window layer is between 0.5 and 30 μm.

BRIEF DESCRIPTION OF THE DRAWING

The FIGURE shows the structure of a light emitting diode with window layer.

DESCRIPTION OF THE PREFERRED EMBODIMENTS

On a substrate 1 of gallium arsenide GaAs and the electrical contact 7 relating to the substrate 1, the dual hetero structure is deposited epitaxially as an active zone. This dual hetero structure consists of a first cladding layer 2 of $In(0.48)Ga(0.12)Al(0.4)P$, an active layer 3 of $In(0.48)Ga(0.37)Al(0.15)P$, a second cladding layer 4 of $In(0.48)Ga(0.12)Al(0.4)$. On this second cladding layer 4, the window layer 5 of $Ga(0.8)Al(0.2)P$ is deposited epitaxially. On window layer 5, another electrical contact 6 is applied that covers only a part of the upper side of the window layer 5. When the light emitting diode of this example is operating, an emission is released with a wavelength of 590 nm (yellow). When the light emitting diode is operating, a current flows from contact 6 to contact 7 or vice versa according to the polarity of the diode and in the window layer 5 of contact 6 the current path widens out to the full cross-section of the diode. The polarity of the various layers of the light emitting diode can be: Substrate 1, n-conductive, first cladding layer 2, n-conductive, active layer 3, n-conductive, second cladding layer 4, p-conductive, and window layer 5, p-conductive. In the case of the inverse conductivity type of the aforementioned layers, the current flows in the opposite direction.

Because the window layer 5 in accordance with the invention is made of gallium aluminum phosphide (GaAl)P, it has a higher band distance than state-of-the-art window layers and therefore absorbs less light so that the diode has a greater brightness. The aluminum content of the window layer can be in the range of 0.1 to 50%. Preferably, the thickness of the window layer is between 0.5 and 30 μm.

What is claimed is:

1. Light emitting diode of indium gallium aluminum phosphide ((InGaAl)P) with a substrate, an electrical contact to the substrate, a dual hetero structure as an active zone comprising a first cladding layer, an active layer and a second cladding layer, a window layer applied to the second cladding layer, and an electrical contact applied to the window layer, and wherein the window layer is made of gallium aluminum phosphide ((GaAl)P).

2. Light emitting diode in accordance with claim 1, wherein the aluminum content of the window layer is between 0.1% and 50%.

3. Light emitting diode in accordance with claim 1, wherein the thickness of the window layer is between 0.5 and 30 µm.

4. Light emitting diode in accordance with claim 2, wherein the thickness of the window layer is between 0.5 and 30 µm.

* * * * *